United States Patent [19]

Mohr

[11] Patent Number: 5,043,528
[45] Date of Patent: Aug. 27, 1991

[54] DEVICE FOR PROVIDING ELECTRICAL CONTINUITY BETWEEN ELECTRICALLY CONDUCTIVE SURFACES

[76] Inventor: Richard Mohr, 6 York Ct., Northport, N.Y. 11768

[21] Appl. No.: 330,772

[22] Filed: Mar. 30, 1989

[51] Int. Cl.⁵ ............................................... H05K 9/00
[52] U.S. Cl. .............................. 174/35 GC; 174/35 R
[58] Field of Search .......... 174/35 GC, 35 R, 35 MS; 219/10.55 D; 267/158, 164, 165

[56] References Cited

U.S. PATENT DOCUMENTS

| 2,133,789 | 10/1938 | Pool | 174/35 GC |
| 3,277,230 | 10/1966 | Stickney et al. | 174/35 GC |
| 3,504,095 | 3/1970 | Roberson et al. | 174/35 GC |
| 4,760,214 | 7/1988 | Bienia et al. | 174/35 GC |

FOREIGN PATENT DOCUMENTS 2601277  7/1976  Fed. Rep. of Germany .
647442  12/1950  United Kingdom .

OTHER PUBLICATIONS

Burgoon, Insulation/Circuits, Aug. 1970, pp. 47–52.
Severinsen, Machine Design, vol. 47, No. 19, Aug. 1975, pp 74–77.
Devore, Electrical Manufacturing, vol. 52, Issue 2, Aug. 1953, pp 122–125.
Intrator, Elec. Eng., Sep. 1953, p. 809.

Primary Examiner—Leo P. Picard
Assistant Examiner—Bot Lee Ledynh
Attorney, Agent, or Firm—Alfred M. Walker

[57] ABSTRACT

A spring finger EMI gasket is disclosed in which portions of its finger parts are so formed that they can be completely flattened with negligible permanent set. Thus when used in a seam, they can be flattened to provide broad area metal-to-metal contact for low electrical impedance across the seam, while at the same time serving as a positive mechanical stop. In its preferred embodiment, when the seam is disassembled, the tips of the finger parts press firmly against one of the surfaces of the seam so as to resist snagging, a frequent cause of damage to spring fingers.

12 Claims, 3 Drawing Sheets

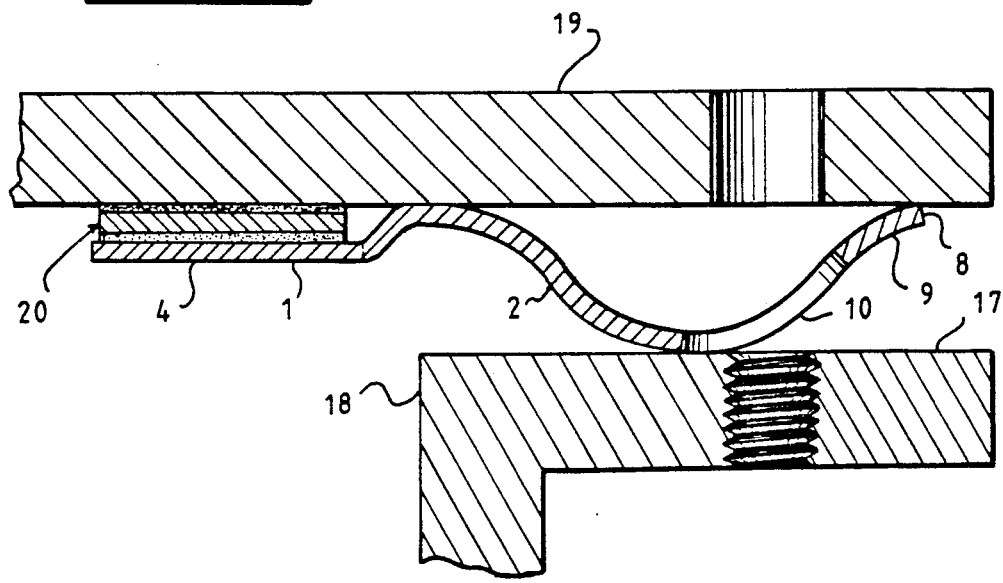
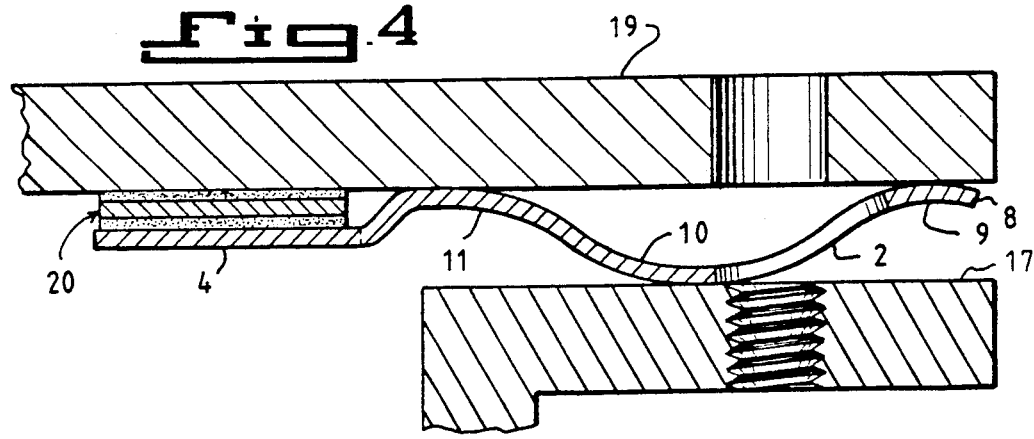
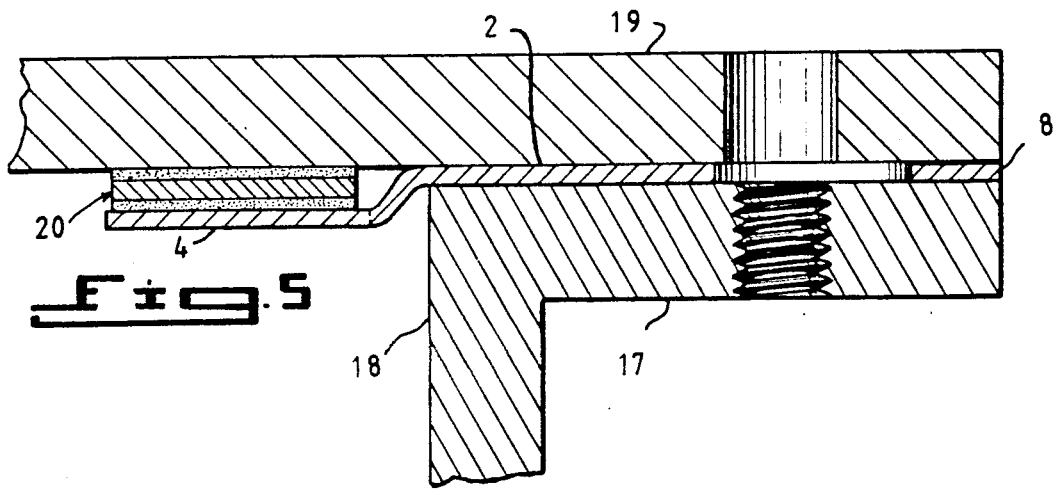

DEVICE FOR PROVIDING ELECTRICAL CONTINUITY BETWEEN ELECTRICALLY CONDUCTIVE SURFACES

BACKGROUND OF THE INVENTION

The present invention relates to a device for providing electrical continuity between two electrically conductive surfaces.

Enclosures for electrical and electronic equipment are frequently required to function as an electromagnetic shield to minimize the undesirable passage of electromagnetic fields into and out of the enclosure. The shielding capability of an enclosure is usually quantitatively defined by the amount by which it will attenuate electromagnetic fields which tend to enter or exit the enclosure. The attentuation is conventionally expressed as the ratio of the incident to attenuated field levels, in decibels, and is termed "Shielding Effectiveness". For high shielding effectiveness the enclosures are frequently constructed of metal having a high electrical conductivity.

As a practical matter the intrinsic shielding effectiveness of the material of the enclosure is generally of less concern than leakage through seams (see Henry Ott, *Noise Reduction Techniques in Electronic Systems,* Pub. John Wiley & Sons, 1976, p. 164). To minimize the seam leakage, particular care is required to maintain high, essentially continuous, electrical conductivity across the seams. For permanent seams this is ideally achieved by means of continuous welding or brazing (see Keiser, *Principles of Electromagnetic Compatibility,* Pub. Artech House, Inc., 1979, p. 121). Non-permanent seams around access covers, doors and the like, present a special problem. If a direct metal-to-metal contact could be obtained all along the length of the seam, then leakage from the seam would be negligible (see Quine et al, *Electromagnetic Shielding Principles,* Vol. 1, Rensselaer Polytechnic Institute, Mar. 1, 1956, p. 82, 83). In practice, with only a discrete number of fasteners and the inevitable unevenness in manufactured parts, there will be slit-type openings in the seam between the fasteners. Leakage through these openings can be significant, especially at high frequencies (see Keiser, ibid, p. 120).

Slit-type leakage can be reduced by minimizing the lengths of the slits by means of increasing the number of fasteners. This is often impractical, or makes for an unattractive product, and alternative approaches are used.

For achieving a multiplicity of electrically conductive contacts, devices known as gaskets are used. Especially effective types of gaskets are spring finger strips, as produced, for example, by Instrument Specialties Co., Inc. of Delaware Water Gap, PA or Tech-Etch, Inc. of Plymouth, MA. The spring fingers are designed to have a range of flexibility, or compliance, which is adequate to comply with unevenness in the manufactured parts.

The known finger strips are not completely satisfactory. The manufacturer frequently specifies performance of the product over a compression range which limits maximum compression to prevent permanent set in, or complete rupture of, the gasket (see Tech Etch, Inc., *Standard Product Specification-Finger Strips-RFI/EMI Shielding or Grounding;* see also Instrument Specialties, Inc., *Product Specification Sheet for Sticky Fingers for Instant RFI/EMI Shielding,* U.S. Pat. No. 3,504,095). This application limitation is undesirable, as auxiliary means required to limit the compression are frequently costly. Further, experimental results by the inventor, Richard Mohr, with a gasket he specifically designed to be compressed in use beyond the typically recommended range of 25% to 75%, and to be completely flattened without permanent set, showed shielding performance improvement, 100 KHz to 300 MHz, as follows:

| MEASURED TRANSFER IMPEDANCE VS. PERCENT COMPRESSION | |
|---|---|
| Compression (%) | Relative Improvement (dB) |
| 10 | 0 (Baseline Reference) |
| 25 | 12 |
| 50 | 22 |
| 75 | 27 |
| 100 | 31 |

In the gasket tested, when closing force was increased about 35% beyond that required for 100% compression, shielding performance increased an additional 4 dB.

An additional disadvantage of known spring finger gaskets is that they are prone to damage, as by snagging. Known means to minimize the possibility of such snagging damage typically add to the cost of the device or the cost of their utilization, and/or inhibit their electrical performance. The foregoing disadvantages will become clear in the following review of the existing state of the art.

Auxiliary means of preventing over-compression include the use of a groove in one of the conducting surfaces of the seam to house the gasket as disclosed for example in U.S. Pat. No. 4,572,921. Similar solutions are employed in Soviet Inventor's Certificates Nos. 438,156 and 372,759. While the approach is effective, machining the groove is costly.

Another approach for preventing over-compression includes the use of screws, rivets or special fasteners to secure the spring finger strip in place and to double as a positive stop, such as suggested, for example, by Instrument Specialties Co., Inc. for their Part Number 97-438, and as disclosed in German Patent Document No. 1,035,219. These stops are however not fully positive since the fasteners for securing the seam must be physically offset from the fasteners which secure the spring finger strip. The seam therefore tends to buckle as it is secured.

In the device disclosed in the U.S. Pat. No. 3,962,550 there is no complete closure since the gap is still left. The same disadvantage is present in the devices disclosed in the Danish Patent No. 93,744 and German Patents Nos. 1,035,219 and 2,235,216. In the U.S. Pat. No. 4,623,752 the spring is not designed to be fully compressed; maximum compression is limited by push-in fasteners which can function as a positive stop. In European Patent No. 0 030 529 a hinge is provided which could be employed to limit compression, however hinges are known to provide only poor conductive paths in a shield (see Filtron Company, Inc., *Interference Reduction Guide for Design Engineers,* Vol. 1, U.S. Dept. of Commerce, National Technical Information Service, Aug., 1964, p. 2-31). In the European Patent No. 0 159 407 an extra pocket is provided in one member of the seam to house opposing sets of spring fingers, and the opposing member of the seam enters the pocket displacing the spring fingers laterally. The disadvantages of this arrangement are, the added complexity due to the pocket and the two sets of fingers, and the incomplete compression of the spring fingers. A similar arrangement, and similar disadvantages exist, in the German Patent No. 26 01 277.

The possibility of snagging is minimized in the Soviet Inventor's Certificate No. 372759 but with the added complication of a required containment groove. The arrangements in European Patent No. 0 159 407 and German Patent No. 26 01 277 protect the fingers but with added mechanical complexity, and with degraded electrical performance because of incomplete compression.

The snagging is minimized in No-Snag Fingers manufactured by Tech-Etch, Inc., Part No. 187M60 (see Tech Etch, Inc., product specification sheet, No-Snag Fingers Part No. 187M60, NSFIA). In these strips the fingers are joined at both ends and the joining strips are rolled under to prevent snagging. The joining of fingers at both ends limits however their independent action to the detriment of the electrical seal. In the Foldover series by Instrument Specialties Co., Inc. Part 97-452, additional spring fingers in the base section of he strip are folded under the strip and up and over the tips of the spring fingers (see Instrument Specialties, Co., Inc., *Product Specification Sheet for Sticky Fingers,* U.S. Pat. No. 3,504,095, for Foldover Series). This protects the fingers, however the finger tips no longer directly contact the surfaces of the seam, to the detriment of the electrical seal.

SUMMARY OF THE INVENTION

Accordingly, it is an object of the present invention to provide a device for providing an electrical continuity between two electrically conductive surfaces, which avoids the disadvantages of the prior art. More particularly, it is an object of the present invention to provide a device of the above mentioned type, in which portions of its spring fingers can be completely flattened, between the electrically conductive surfaces, thus simultaneously providing a positive metal-to-metal mechanical stop and high electrical continuity between the electrically conductive surfaces, and which is snag-resistant while at the same time is inexpensive to manufacture, and simple to install and to remove.

In keeping with these objects and with others which will become apparent hereinafter, one feature of the present invention resides in a device which has a one-piece electrically conductive sheet including a plurality of finger parts which are spaced from one another, and a joint part which connects the finger parts with one another at their root end, wherein said finger parts are so curved that when mounted for use, their tips press firmly against a substantially flat surface of the structure to which they are mounted, and when the curved finger parts are clamped between said surface and a second substantially flat electrically conductive surface, they can be completely flattened to assume a rectilinear shape to provide broad area metal-to-metal contact with both surfaces, and to form a positive stop between the surfaces without being permanently deformed. When the device is designed in accordance with these features, it achieves the above specified objectives.

In accordance with an advantageous feature of the present invention, the joint part is flat so it may be easily deflected perpendicular to its plane allowing it to conform with irregularity in its mounting surface. The flat shape also allows the user to easily cut the strip to required length using hand shears. Additionally, each finger, beginning at, or near its distal end point, or tip, is gently and continuously curved in a series of opposite bends, serpentine fashion, which finally terminate at or near the joint part. An additional optional transition portion may be provided to facilitate accommodation of a fastening device. The portion of fingers containing the gentle continuous bends is referred to herein as the active portion of the fingers. The active portion of the fingers are intended, in use, to cover essentially the full width of the seam. The control of the radius of curvature of the bends and their arc lengths is responsible for achieving good accommodation to joint irregularity, or compliance, no permanent set after being flattened, and resistance to snagging.

The novel features of the present invention are set forth in particular in the appended claims. The invention itself however both as to its construction and its manner of operation, will be best understood from the following description of preferred embodiments, which is accompanied by the following drawings.

BRIEF DESCRIPTION OF THE DRAWINGS

FIG. 3 is a side sectional view taken on the line 3—3 in FIG. 1 but showing the inventive spring finger strip arranged for use between two electrically conductive surfaces;

FIG. 4 is a side view corresponding to the view of FIG. 3, but with the inventive spring finger strip partially compressed in the seam between the two electrically conductive surfaces;

FIG. 5 is a side view corresponding to the view of FIG. 3, but with the inventive spring finger strip in a fully compressed condition in the seam between the two electrically conductive surfaces;

DESCRIPTION OF A PREFERRED EMBODIMENT

Figure 1:
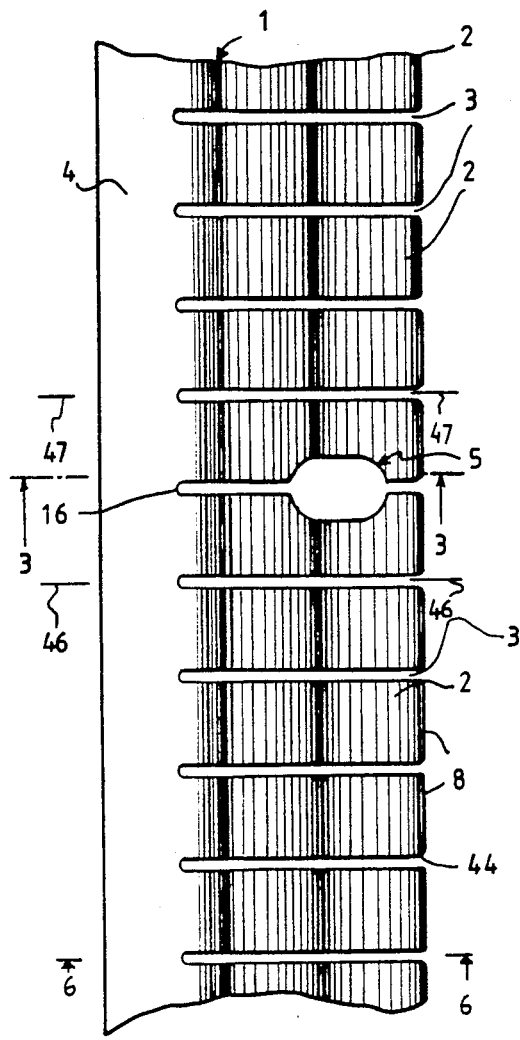
FIG. 1 is a top plan view of one embodiment of the inventive device for providing an electrical continuity between two electrically conductive surfaces in accordance with the present invention, as embodied in a spring finger strip.

FIG. 1 shows one embodiment of the inventive device for providing electrical continuity between two substantially flat electrically conductive surfaces. It includes a one-piece strip which is identified as a whole with reference numeral 1. The strip is composed of a material, such as beryllium copper, stainless steel or phosphor-bronze, which is electrically conductive, and which has desirable spring properties. It can be produced by initially annealing a blank of the material, then forming the fingers, and through holes, if required, by cutting, punching, etching, etc. in a manner which is well known to those skilled in the art. Additional manufacturing operations will be described in connection with FIG. 2.

Figure 1A:
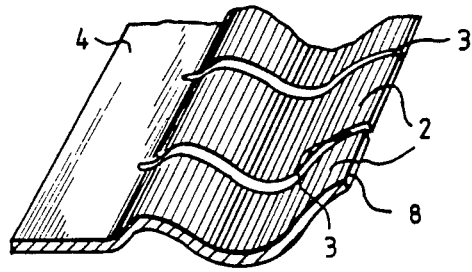
FIG. 1A is a perspective view of a portion of the device as shown in FIG. 1.

The strip 1 has a plurality of fingers 2 which are separated from one another by narrow slots or spaces, 3, and a joint part 4 which connects the fingers with each other at their root end 16. A, preferably elongated, through-hole 5 is optionally provided to allow passage of a fastener for securing the seam. The fingers 2 are formed as shaped elements having a special configuration as indicated in FIG. 1A, and as shown in detail in FIG. 2, as will be explained hereinbelow.

Figure 2:
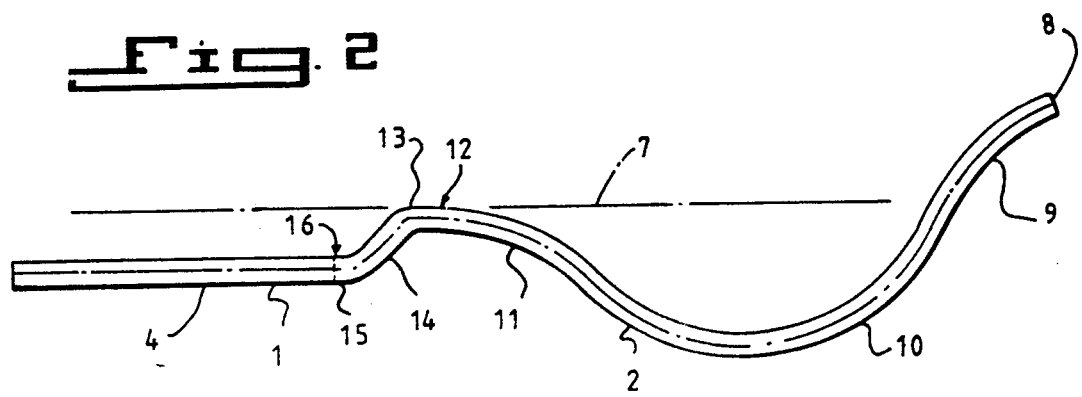
FIG. 2 is a side elevational view of a typical inventive spring finger strip drawn in section along line 6—6 of FIG. 1, in an initial position before being arranged for use between two electrically conductive surfaces.

As shown in FIG. 2, reference numeral 7 identifies the line which corresponds to the plane of an electrically conductive cover to which the strip 1 is intended to be attached. The joint part 4 is straight and flat and extends substantially parallel to the line 7. Each finger 2 has a distal end point, or tip 8, which is opposite to the joint part 4. Then each finger 2 has a plurality of portions 9, 10, 11, 13, 14 and 15 which successively extend between the tip 8 and the joint part 4. These portions include a first gently curved portion 9 which is relatively short and extends from the tip 8 in a counter-clockwise direction downwardly in FIG. 2. Then a second, typically longer, gently curved portion 10 extends from the first curved portion 9 in a clockwise direction and terminates in a third, relatively short gently curved portion 11 which continues counter-clockwise, finally terminating tangent to the reference line 7 at point 12. The gently curved portions 9, 10 and 11 join each other where their tangents are coincident, and the interconnected curves are therefore smoothly continuous. A first straight portion 13 extends tangentially from the third curved portion 11 along the reference line 7 parallel to the joint part 4. Then a second straight portion 14 extends from the first straight portion 13 and is inclined to the reference line 7 and to the joint part 4. Finally, a third straight portion 15 extends from the second straight inclined portion 14 in alignment with the joint part 4 and is connected with the latter at the point 16 which defines the root of the finger 2. The straight portion 14 is preferably connected with. the straight portions 13 and 15 by short arcs. The section of finger 2 between points 8 and 12 is the active portion of finger 2, defined in the SUMMARY OF THE INVENTION, herein. The shape of the active portion of the finger 2 is characteristic of this invention. The shape of the portion of finger 2 between points 12 and 16 is specific to the mounting means selected for illustration here as shown in FIG. 3. Other mounting means are possible without departing from the spirit of the invention; examples will be detailed later. A precise geometrical description of the preferred shape of the active portion of the finger 2 is given in the descriptive material in connection with FIG. 6.

As can be seen from FIG. 2, the tip 8 of the finger 2, and curved section 11 of the finger 2 are situated on opposite sides of the reference line 7. It will become clear in the discussion relative to FIG. 3 that it is this provision which contributes to the snag-resistance property of the device.

It is believed to be clear that after shaping the finger 2 of the strip 1 in accordance with the above described configuration, the strip 1 is preferably heat treated, by methods which are well known to those skilled in the art, for imparting desirable spring and strength qualities. Additionally, optional surface treatment including cleaning and plating may be performed by methods which are well known to those skilled in the art.

In FIG. 3 the spring finger strip 1 in accordance with the present invention is located between a flange 17 of an enclosure, represented by its wall 18 and flange 17, and a cover 19 for the enclosure. The view of the strip is at a sectional view taken on the line 3—3 in FIG. 1. The strip 1 is attached to the cover 19 by a double-sided adhesive layer 20 which may or may not be supplied as part of the gasket. In this initial position the tip 8 of the finger 2 is deflected from its original position after manufacture and abuts against the surface of the cover 19 since the joint part 4 is fixed to the cover 19 by means of the adhesive layer 20. It is this positioning of the tip 8 of the finger 2 tightly against the cover which imparts the property of snag-resistance to the strip. In the position of the cover 19 shown, the second curved portion 10 of the finger 2 just contacts the surface of the flange 17 of the enclosure.

In FIG. 4 the seam is partially closed. The curved portion 10 of the finger 2 is partially flattened and contacts the surface of the flange 17 of the enclosure over a broad area. The curved portion 11 of the finger 2 is partially flattened against the cover 19. Also, the tip 8 of the finger 2 is deflected away from the surface of the cover 19 and the curved portion 9 of the finger 2 is partially flattened against the cover 19. The broadening of contacts, as described, as the seam is closed, provides a lowered resistive contact between the surfaces. Also, importantly, the length of the portions of the finger 2 which bridge the gap between the surfaces of the seam is shortened, resulting in a decreased high frequency impedance across the seam.

In the position shown in FIG. 5 the active portion of finger 2 is fully compressed. The active portion of the finger 2 is rectilinear and ideally provides a continuous electrical contact with both surfaces of the seam along the full width of the seam. The thusly produced seam is then effectively electrically continuous to very high frequencies.

Figure 6:
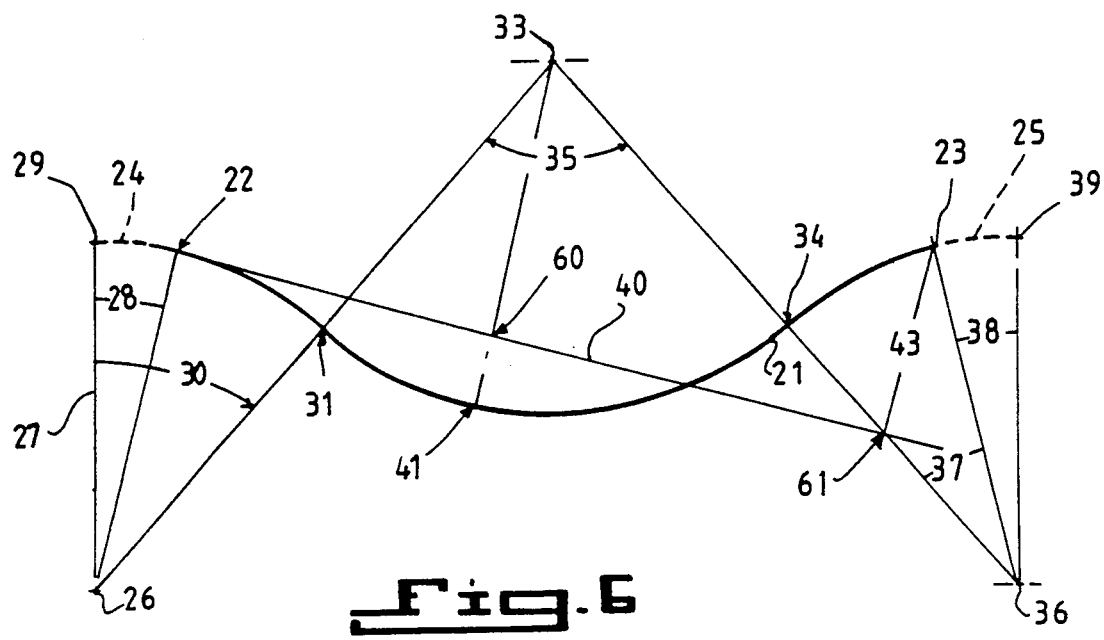
FIG. 6 is a line drawing representation of a side view of the active portion of the spring finger showing the geometrical generation of the preferred shape of the inventive spring finger strip.

The shape of the active portion of the finger 2 between points 8 and 12 of FIG. 2 may be defined geometrically with reference to FIG. 6. The optimum final shape, including arc lengths, and radii of curvature is specific to the intended application. Selection criteria for these and other parameters for the device in accordance with this invention are given after the geometrical description of the active portion of the finger 2.

For preferred design, all radii are equal to each other and the construction as illustrated in FIG. 6 is symmetrical about a vertical through the center of the FIG. 6 illustration. The active portion of the finger 2 is represented by its median line 21 drawn between points 22 and 23, and is shown as a solid line. The dashed arcs 24, 25 are not part of the active portion 21 of the finger 2, but are included to facilitate its geometrical definition. Using point 26 as a center of curvature, a radius 27 of R is rotated clockwise, with its tip starting at point 29, through an angle 28 of A, its tip thus defining the imaginary dashed arc 24 between points 29 and 22. Rotation of the radius R is continued, through a total angle 30 of B, its tip then defining the additional arc between points 22 and 31. Point 33 is established as diametrically opposite point 26 through point 31 as a center. Using point 33 as a center of curvature and a radius of R, the radius is rotated, with its tip starting at point 31, counterclockwise through an angle 35 of 2B, its tip then defining the arc between points 31 and 34. Point 36 is established as diametrically opposite point 33 through point 34 as a center. Using point 36 as a center of curvature, and a radius of R, the radius is rotated, with its tip starting at point 34, clockwise through an angle 37 of B-A, its tip defining the arc between points 34 and 23. The radius is rotated an additional angle 38 of A, its tip defining the imaginary dashed arc 25 between points 23 and 39.

For this illustration, it is assumed that point 23 corresponds, in the FIG. 1 illustration, to the tip 8 of the spring finger 2, and that the point 22 corresponds, in the FIG. 1 illustration, to the point 12 near the root 16 of the spring finger 2. The tangent line 40 to the arc between points 22 and 31 at point 22 corresponds to the reference line 7 in FIG. 2. Point 41 is established as the intersection of a parallel to the line between points 22 and 26, through point 33, with the spring 21. Point 60 is established as the intersection of the line between 33 and 41 with the line 40. The length of the line from 41 to 60 is the perpendicular distance of point 41 to line 40 and is, $$h_1 = 4R \sin^2 \frac{B-A}{2}$$

The point 61 is established as the intersection of a perpendicular line to the reference line 40 through point 23. The length of the line 43 from point 23 to 61 is the perpendicular distance of point 23 to the line 40 and is defined herein as the overhang, and is, $$h_2 = 2R (\sin A)(2 \sin B - \sin A)$$

The length of line from point 22 to 60 is, $$L_1 = 4R \left( \sin \frac{B-A}{2} \right)\left( \cos \frac{B-A}{2} \right)$$

The length of line from point 22 to 61 is, $$L_2 = 2R (\cos A)(2 \sin B - \sin A)$$

With the spring 21 held tangent to the line 40 at point 22 and its tip 23 deflected clockwise to contact the line 40, the separation between point 41 and line 40 will increase. The new separation, h, may be estimated by modeling the spring as a straight cantilever beam between points 22 and 61, supported at point 22. The deflection of point 60, as point 61 is deflected a distance equal to the length between points 23 and 61, is approximately equal to the increase of maximum separation of the spring to the reference line 40 when the spring 21 is deflected so its tip 23 rests on the reference line 40. The maximum separation, h, is then, $$h = h_1 + h_2 \left( \frac{L_1}{L_2} \right)^2 \left( 3 - \frac{L_1}{L_2} \right)$$

The value, h, is the compliance of the spring. The overall length of the spring 21 from points 22 to 23, is, $$L = R(4B - 2A)$$

It is clear from the foregoing equation that the desired length, L, may be achieved with a variety of values of R, A and B satisfying the equation. However, from inspection of FIG. 6, it is apparent that to achieve a a relatively large value of h with a fixed value of L, R should be chosen to provide a large value of L/R. In practice, a lower bound on the value of R, and therefore upper bound on L/R, is required to avoid permanent set after the spring is flattened. This lower bound is a function of thickness, t (in), of the material, its modulus of elasticity, Y (lb/in$^2$), and its maximum yield strength, S (lb/in). The minimum value of R/t of the spring 21 can then be predicted from Hausman and Slack, *Physics*, Pub. Van Nostrand and Co. 1939, p. 172, as, $$\frac{R}{t} = \frac{Y}{2S_m}$$

A common measure of yield strength is the stress causing permanent elongation of 0.2% (see Murphy, *Properties of Engineering Materials*, Pub. International Textbook Co., 1947, pp. 50–51). For beryllium copper alloy CA179 with characteristics as documented in Instrument Specialties Co., Inc., *Precision Springs From Versatile Beryllium Copper*, catalog 15-B, pp. 20, 22, the minimum value of $\overline{\phantom{R}}$/t is computed from the foregoing equation as, $$\frac{R}{t} = 18.5 \times 10^6 / 2 \times 140 \times 10^3 = 66.2$$

Experimentally this has been found to be conservative for purposes of this invention, and a practical lower bound of 38, or about 60% of the theoretical minimum value of R/t, was determined by the inventor. Therefore, the above expression may also be defined in an equation where curvature in each of the arc-shaped sections is greater than $0.60 \times 0.5$ Yt/Sm, or 0.3 Yt/Sm, where Y = modulus of elasticity of the material of which said fingers are fabricated; t = thickness of the material and Sm = yield strength of the material. For safety margin, and long life, R/t for beryll should be no smaller than 45 and, preferably, 50 or larger. Also, for ruggedness, the L/t ratio should be limited to approximately 200 or less. With the recommended limits of R/t and L/t, the maximum value of L/R for beryllium copper is then nominally 4.5.

Examination of FIG. 6 reveals that when the tip 23 of the spring 21 is brought into contact with the line 40, as previously described, the spring 21 will be inclined to the line 40 at the point of contact at an angle no greater than A. A small angle of A is desirable so that in use the tip 23 of the spring 21 will slide easily along the seam when the spring 21 is compressed. Based on these considerations, the angle, A, should be less than approximately 0.3 radians.

The overhang 43, h$_2$, should be large enough to assure that in use there is adequate contact force at the tip 23 to resist snagging, and small enough that mounting of the strip is not complicated. A value of h$_2$/L in the range from 0.15 to 0.25 is recommended. The tabulation below summarizes the parameters and characteristics of spring fingers with h$_2$/L = 0.2 and L/R in the range 1.5 to 4.5.

| L/R | A | B | h/L |
| --- | --- | --- | --- |
| 1.5 | 0.212 | 0.481 | 0.086 |
| 2 | 0.218 | 0.609 | 0.121 |

| L/R | A | B | h/L |
| --- | --- | --- | --- |
| 2.5 | 0.225 | 0.738 | 0.154 |
| 3 | 0.235 | 0.868 | 0.185 |
| 3.5 | 0.247 | 0.999 | 0.214 |
| 4 | 0.262 | 1.131 | 0.242 |
| 4.5 | 0.280 | 1.265 | 0.269 |

The tabulation confirms that the larger L/R values yield larger values of relative compliance, h/L. The smaller L/R values may be preferred in applications, for example, where a lower closing force is desired, or where a relatively thick material is chosen, say, for greater ruggedness.

It is believed to be clear that the preferred spring shape having bends consisting of substantially circular arcs of equal radii of curvature are optimum in the embodiment of this invention because, when fully compressed, the maximum stress along the length of the spring finger is essentially uniform with no regions of excessive stress concentration.

Finger widths should be relatively narrow to assure frequent contacts of the strip along the length of the seam in the presence of seam irregularity, but preferably wide enough to accommodate through-fasteners either between or through the fingers. A length to width ratio in the range 1:1 to 6:1 is preferred. The finger tip 8 is preferably rounded as indicated at 44 in FIG. 1 to minimize scratching of the seam's surfaces. A radius of curvature for the rounding at 44 of nominally 2 to 5 times the thickness of material is preferred. The spaces designated as 3 between fingers are required to define the fingers and to permit their independent action. These spaces should be narrow or they could cause substantial electromagnetic leakage and their presence effectively subtracts from the total potential contact area. The minimum width of the spaces 3 is primarily dictated by the manufacturing process; if punched, the minimum width will be typically 5 to 10 times the thickness of the material; if chemically etched, minimum widths comparable with the material thickness are possible. The width of the space 3 should never exceed ¼ the length of the active portion of the finger 2 to assure that waveguide-below-cutoff attenuation in these spaces is theoretically greater than 100 dB. Rounding of the space 3 as indicated at 16 in FIG. 1 should be provided at the root of the finger 2 to minimize stress concentrations in this area. In its manufacture, the strip 1 is preferably free of burrs which could cause scratching in the seam, and could inhibit full compression.

Figure 7:
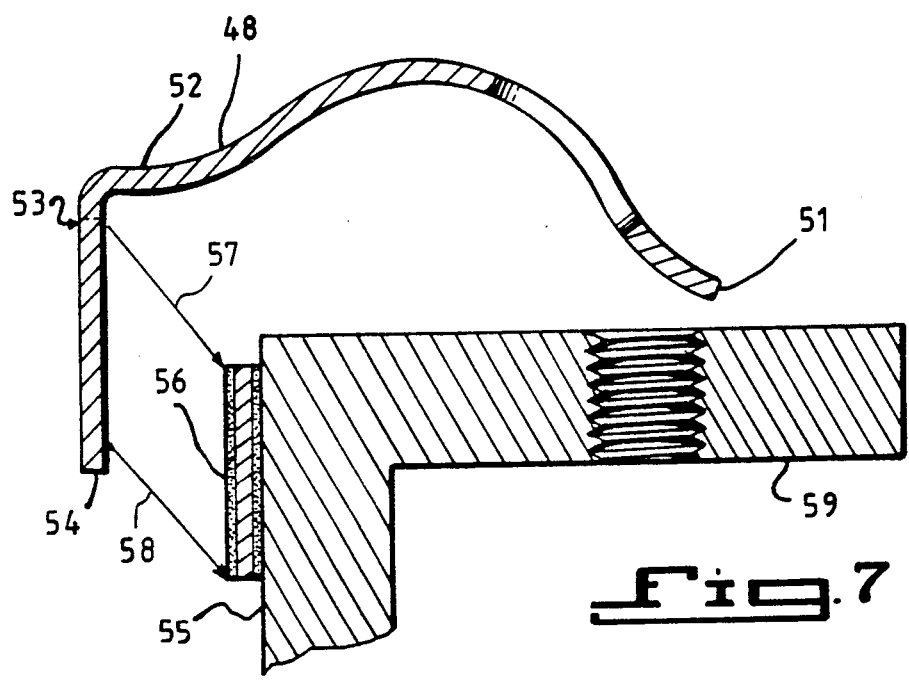
FIG. 7 is a side view in section of another embodiment of the inventive spring finger strip which is fashioned for mounting on the wall of an enclosure, also shown in the figure.
Figure 8:
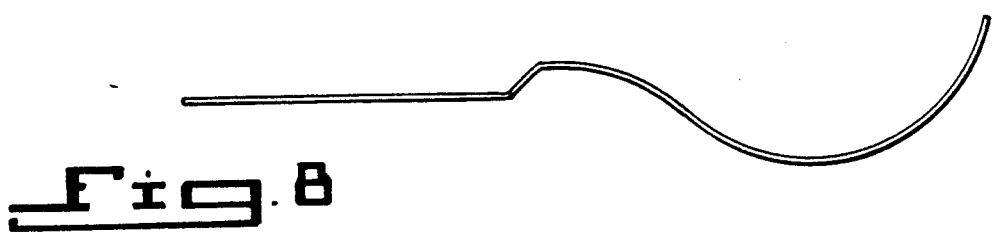
FIG. 8 is a side view in section of another embodiment of the inventive spring finger device.

It is believed to be clear that considerable latitude around the preferred embodiment of the device is possible while still remaining within the spirit of the invention. One example could be the variation in the preferred shape of the active section by, say, in the configuration of FIG. 6, not using equal radii throughout, or by interposing additional arcs or straight sections between the arcs comprising the spring 21, or by deviating from the symmetry by modifying or completely eliminating, say, the arc from 34 to 23. This will result in another embodiment of the inventive spring finger device as illustrated in FIG. 8. With a device as illustrated in FIG. 8, it can be shown that the desirable properties of the inventive device may be achieved when the arc angle $\theta_1$, of the arc-shaped section closest to the joint part is greater than zero and less than $\pi/3$ and wherein the arc angle $\theta_2$, of the second arc-shaped section is greater than $\theta_1 \pi/2 - \sin^{-1}(2\cos\theta_1 - 1)$ and less than $\pi$. In general, such deviations will in use impact in whole, or in part, maximum achievable compliance, maximum stress under compression, contact force at the tip 8 of the finger 2, or the angle of contact at the tip 8 of the finger 2. Other variations could include the shape, location, or elimination, of the through-hole 5. When required, the through-hole 5 is preferably elongated so it will not interfere with a through-fastener as the active portion of the strip 1 is compressed. The through-hole 5 may be placed through the body of a single finger 2, however the location between fingers, as shown in FIG. 1, is preferred as it weakens the fingers less than the single finger containing a through-hole would be weakened. The strip may be supplied without through-holes, leaving it up to the user to form the holes as required. Also, as shown in FIG. 1, alternatively, short sections of strip, as between "46—46" and "47—47" may be supplied as separate parts to be installed by the user between sections of the strip 1 as required. Additionally, the intermediate section between points 12 and 16, as shown in FIG. 2, may be modified to accommodate different mounting configurations. An example variation for mounting the strip is shown in FIG. 7. In this illustration, a side view in section of the strip is shown in a view analogous to that of FIG. 2. The strip is identified as a whole with reference numeral 48. The section between 51 and 52 corresponds in this illustration to the respective section between points 8 and 12 in FIG. 2. The section between points 53 and 54 corresponds in this illustration to the respective joint section 4 in FIG. 2. The strip is shown in a position ready to be attached to an enclosure represented by its wall 55 and flange 59. Attachment is intended via a double-sided adhesive strip 56 already secured to the wall 55. With the strip 48 attached to the double-sided adhesive strip 56 as indicated by the arrows 57, 58, the strip 48 will be tangent to the flange 59 in proximity to point 52, and the tip 51 of the strip 48 will be firmly pressed against the flange 59. It is believed to be clear that in use the active portion of the strip 48 between points 52 and 51 will behave analogously to the behavior of the strip as described in connection with FIGS. 3, 4, 5. Additional mounting variations including, for example, bending of the intermediate section of fingers and joint section to form a clip, or the use of other adhesives such as epoxy, or mechanical fasteners such as rivets, screws, and the like, will not deviate from the spirit of the invention. It is believed to be clear that special sections within the spirit of this invention may be formed to be used at the corners of the enclosures.

It should also be clear that in use the active portion need not extend completely across the surface of the seam, and that part of the active portion of the fingers may lie outside the seam in proximity to the joint part, also that part of the first straight part of the spring fingers may be within the seam.

It is then clear that the invention is not limited to the details shown since various modifications and structural changes are possible without departing in any way from the spirit of the invention.

What is desired to be protected by Letters Patent is set forth in particular in the appended claims.

I claim:

1. A device for providing electrical continuity between two substantially flat surfaces, comprising, as a minimum, a one-piece electrically conductive sheet including a plurality of finger parts and a joint part joining said finger parts spaced from one another, said finger parts having curved portions being so curved that when said curved portions of said finger parts are clamped between two substantially flat surfaces they conform to the latter and completely straighten to extend rectilinearly and to contact the surfaces over a broad area and to serve as a positive stop between the surfaces, without being permanently deformed, said curved portions of each of said finger parts being of a series of at least two arc-shaped sections which are interconnected in such a manner that the sense of curvature of each arc-shaped section is opposite to that of its adjacent said arc-shaped section, and wherein said interconnection is smoothly accomplished resulting in a serpentine-shaped section, so configured that the arc-shaped section of said serpentine-shaped section which is closest to said joint part and the point of the arc-shaped section of said serpentine-shaped section which is farthest removed from the joint part are on opposite sides of a tangent to the point of said serpentine-shaped section which is closest to said joint part, and means to return said arc-shaped sections to their respective original, curved shapes after said curved shapes have been completely flattened and wherein said means comprises a series of arc-shaped sections each having a minimum radius of curvature greater than, $0.3Yt/S_m,$ wherein,
Y = Modulus of elasticity of the material of which said fingers are fabricated
t = thickness of said material
$S_m$ = yield strength of said material.

2. A device as defined in claim 1, wherein each of said arc-shaped sections is a substantially circular arc.

3. A device for providing electrical continuity between two substantially flat surfaces, comprising, as a minimum, a one-piece electrically conductive sheet including a plurality of finger parts and a joint part joining said finger parts spaced from one another, said finger parts having curved portions being so curved that when said curved portions of said finger parts are clamped between two substantially flat surfaces they conform to the latter and completely straighten to extend rectilinearly and to contact the surfaces over a broad area and to serve as a positive stop between the surfaces, without being permanently deformed, said curved portions of each of said finger parts consists of a series of at least two arc-shaped sections which are interconnected in such a manner that the sense of curvature of each arc-shaped section is opposite to that of its adjacent said arc-shaped section, and wherein said interconnection is smoothly accomplished resulting in a serpentine-shaped section, so configured that the arc-shaped section of said serpentine-shaped section which is closest to said joint part and the point of the arc-shaped section of said serpentine-shaped section which is farthest removed from the joint part are on opposite sides of a tangent to the point of said serpentine-shaped section which is closest to said joint part, each of said arc-shaped sections is a substantially circular arc, and, all of said arc-shaped sections have substantially the same radius of curvature.

4. A device as defined in claim 3, wherein said serpentine-shaped section contains two of said substantially circular arcs.

5. A device as defined in claim 4, wherein the arc angle, $\theta_1$, of the arc-shaped section closest to the joint part is greater than zero and less than $\pi/3$ and wherein the arc angle $\theta_2$, of the second arc-shaped section is greater than, $\theta_1 + \pi/2 - \sin^{-1}(2\cos\theta_1 - 1)$ and less than $\pi$.

6. A device for providing electrical continuity between two substantially flat surfaces, comprising, as a minimum, a one-piece electrically conductive sheet including a plurality of finger parts and a joint part joining said finger parts spaced from one another, said finger parts having curved portions being so curved that when said curved portions of said finger parts are clamped between two substantially flat surfaces they conform to the latter and completely straighten to extend rectilinearly and to contact the surfaces over a broad area and to serve as a positive stop between the surfaces, without being permanently deformed, said curved portions of each of said finger parts consists of a series of at least two arc-shaped sections which are interconnected in such a manner that the sense of curvature of each arc-shaped section is opposite to that of its adjacent said arc-shaped section, and wherein said interconnection is smoothly accomplished resulting in a serpentine-shaped section, so configured that the arc-shaped section of said serpentine-shaped section is closest to said joint part and the point of the arc-shaped section of said serpentine-shaped section which is farthest removed from the joint part are on opposite sides of a tangent to the point of said serpentine-shaped section which is closest to said joint part, each of said arc-shaped sections is a substantially circular arc, all of said substantially circular arcs have substantially the same radius of curvature, and, said serpentine-shaped section contains three of said substantially circular arcs.

7. A device as defined in claim 6, wherein the arc angle of said arc-shaped section on either end of said serpentine-shaped section is substantially equal to B-A and wherein the remaining arc-shaped section has an angle equal to 2 B and wherein B and A are each the absolute value of the radian measure of said arc angles, and wherein B is less than $\pi/4$.

8. A device for providing electrical continuity across a seam between two substantially flat surfaces, comprising, as a minimum, a one-piece electrically conductive sheet including a plurality of finger parts and a joint part joining said finger parts spaced from one another, said finger parts having curved portions being so curved that when said curved portions of said finger parts are clamped between two substantially flat surfaces they conform to the latter and completely straighten to extend rectilinearly and to contact the surfaces over a broad area and to serve as a positive stop between the surfaces, without being permanently deformed, and, at least one of said finger parts contains a through-hole suitable to allow passage of a mechanical fastener for securing said seam, said through-hole is elongated in a direction along said spaces between said finger parts.

9. A device for providing electrical continuity across a seam between two substantially flat surfaces, comprising, as a minimum, a one-piece electrically conductive sheet including a plurality of finger parts and a joint part joining said finger parts spaced from one another, said finger parts having curved portions being so curved that when said curved portions of said finger parts are clamped between two substantially flat surfaces they conform to the latter and completely straighten to extend rectilinearly and to contact the surfaces over a broad area and to serve as a positive stop between the surfaces, without being permanently deformed, a through-hole substantially centered in the space between at least two adjacent said finger parts, wherein said through-hole is suitable to allow passage of a mechanical fastener for securing said seam, and wherein said through-hole cuts partially into each of said adjacent finger parts.

10. A device as described in claim 9, wherein said through-hole in said space is in proximity to said curved portions of said finger parts.

11. A device as defined in claim 9 wherein said through-hole is elongated in the direction along said spaces between said finger parts.

12. A device for providing electrical continuity between two substantially flat surfaces, comprising, as a minimum, a one-piece electrically conductive sheet including a plurality of finger parts and a joint part joining said finger parts spaced from one another, said finger parts having curved portions being so curved that when said curved portions of said finger parts are clamped between two substantially flat surfaces they conform to the latter and completely straighten to extend rectilinearly and to contact the surfaces over a broad area and to serve as a positive stop between the surfaces, without being permanently deformed, said curved portions of each of said finger parts consists of a series of at least two arc-shaped sections, and means to return said arc-shaped sections to their respective original, curved shapes after said curved shapes have been completely flattened and wherein said means comprises a series of arc-shaped sections each having a minimum radius of curvature greater than, $0.3Yt/Sm$, wherein, $Y$ = Modulus of elasticity of the material of which said fingers are fabricated
$t$ = thickness of said material
$Sm$ = yield strength of said material.

* * * * *